United States Patent [19]

Shimbo

[11] Patent Number: 4,939,154
[45] Date of Patent: Jul. 3, 1990

[54] METHOD OF FABRICATING AN INSULATED GATE SEMICONDUCTOR DEVICE HAVING A SELF-ALIGNED GATE

[75] Inventor: Masafumi Shimbo, Tokyo, Japan

[73] Assignee: Seiko Instruments Inc., Japan

[21] Appl. No.: 172,029

[22] Filed: Mar. 23, 1988

[30] Foreign Application Priority Data

Mar. 25, 1987 [JP] Japan .................. 62-71018
Apr. 2, 1987 [JP] Japan .................. 62-81659

[51] Int. Cl.$^5$ ............... H01L 21/265; H01L 21/283
[52] U.S. Cl. .................................. 437/41; 437/34;
437/57; 437/162; 437/193; 437/913; 437/44;
437/200; 357/23.9; 357/42; 357/59
[58] Field of Search ............. 437/40, 41, 44, 162,
437/34, 57, 193, 192, 191, 200, 913, 195;
357/23.1, 23.9, 23.11, 41, 42, 59 G, 59 K

[56] References Cited

U.S. PATENT DOCUMENTS

| | | |
|---|---|---|
| 4,359,816 | 11/1982 | Abbas et al. .................. 437/41 |
| 4,378,627 | 4/1983 | Jambotkar ..................... 437/40 |
| 4,414,737 | 11/1983 | Menjo et al. .................. 437/162 |
| 4,419,810 | 12/1983 | Riseman ....................... 437/41 |
| 4,471,522 | 9/1984 | Jambotkar ..................... 437/162 |
| 4,691,435 | 9/1987 | Anantha et al. ................ 437/162 |

OTHER PUBLICATIONS

Huang et al., "A MOS Transistor With Self-Aligned Polysilicon Source-Drain", IEEE Electron Device Letts., vol. EDL-7, No. 5, May 1986, pp. 314–316.
Oh et al., "A New MOSFET Structure With Self-Aligned Polysilicon Source and Drain Electrodes", IEEE Electron Device Letts., vol. EDL-5, No. 10, Oct. 1984, pp. 400–402.

Primary Examiner—Brian E. Hearn
Assistant Examiner—M. Wilczewski
Attorney, Agent, or Firm—Bruce L. Adams; Van C. Wilks

[57] ABSTRACT

The present invention provides a fabrication method of miniature insulated gate semiconductor devices such as MOS and CMOS in which their gates are formed by self-alignment, and in addition, provision of lightly doped drain (LDD) structure is easy. Therefore the present invention is extremely effective in the fabrication of miniature semiconductor devices which can be highly integrated and can operate at high speed.

12 Claims, 8 Drawing Sheets

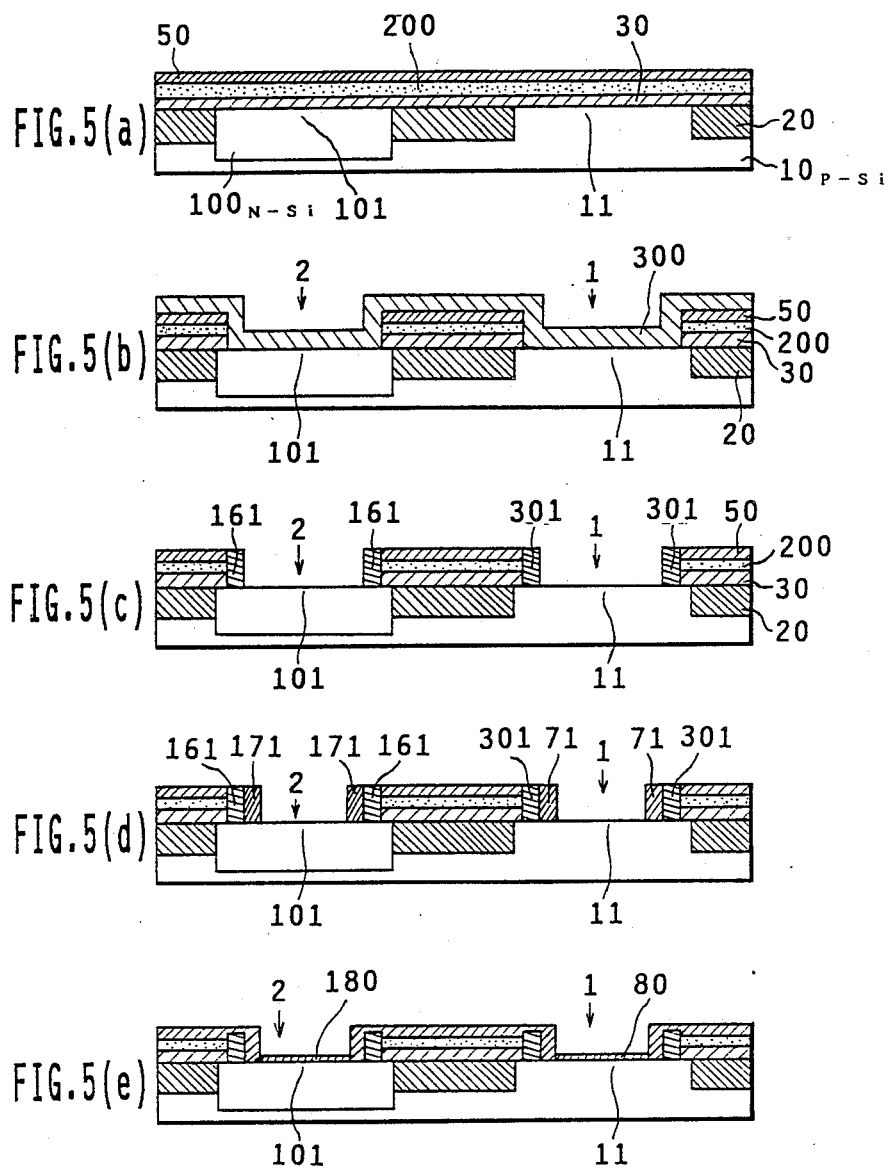

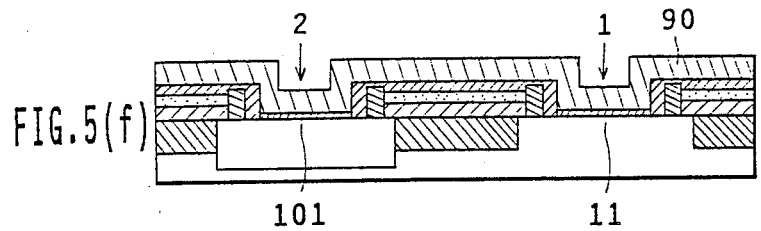
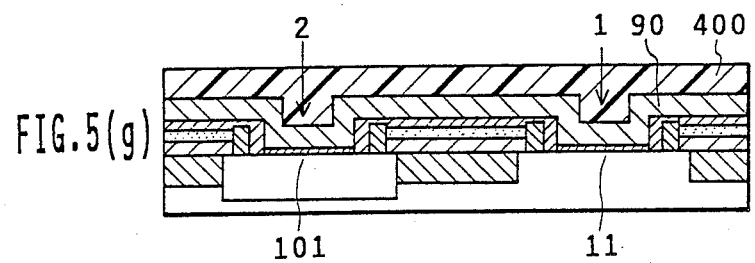
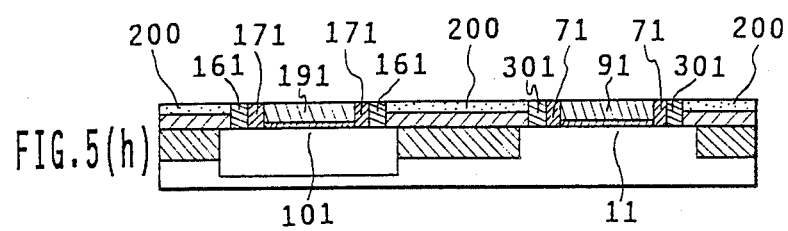
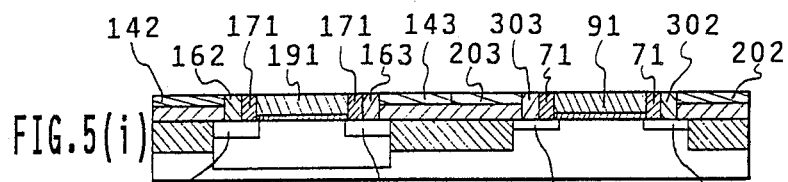
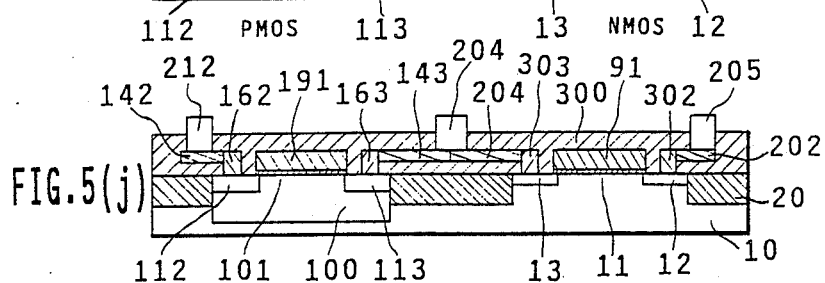

METHOD OF FABRICATING AN INSULATED GATE SEMICONDUCTOR DEVICE HAVING A SELF-ALIGNED GATE

BACKGROUND OF THE INVENTION

1. Field of the Invention

This invention relates to insulated gate semiconductor devices having self-aligned gates, and more particularly to its fabrication method

2. Prior Arts

Miniaturization of transistors has been accelerated from year to year in order to comply with the requirements for higher operation speed and higher integration density. Self-alignment technique is indispensable together with fine etching technique to accomplish miniaturization of devices. A self-aligned fabrication method of bipolar devices, which is called Super Self-Alignment (SST) method, is disclosed in p.283, Vol.19 of "Electronic Letters" published in 1983 and in Japanese Laid-Open Pat. No.15230/1980. This method achieves a delay time of 30 pico second. "Technical Research Report SSD 84-101 of Telecommunication Society" issued on Dec. 18, 1984 describes a MOS self-alignment fabrication method called "MUSA-MOST". According to these two methods, a gate electrode on a gate insulated film side between a drain and a source in the case of a MOS device, or on a contact hole side between a base and an emitter in the case of a bipolar device can be self-aligned. But the other end (the top end) of the gate electrode can not be self-aligned, which results in overlappings at the top end of a gate electrode and parasitic capacitance as a consequence. This parasitic capacitance impedes a higher operation speed of the device. Moreover, the methods mentioned above cannot be easily applied to a Lightly Doped Drain (LDD) structure in a miniature insulated gate semiconductor device.

SUMMARY OF THE INVENTION

The object of the present invention is therefore to provide a fabrication method of a miniature insulated gate semiconductor device such as MOS and CMOS whose gate electrodes are formed by self-alignment. The present invention can also be applied to the fabrication of a miniature insulated gate semiconductor device having an LDD structure. A fabrication method comprising the following steps is employed in order to accomplish the object of the invention.

1. A first step of exposing an active region on the surface of a semiconductor substrate which has one conductivity type and is covered with a field insulating film;
2. A second step of depositing sequentially at least three layers of film comprising a first insulating film, a first semiconductor film having the other conductivity type and a second insulating film;
3. A third step of forming an opening in the multiple layer film in such manner that the opening is narrower than one of the widths of the active region but wider than the other, and that the side of the opening is formed substantially vertical or negatively inclined;
4. A fourth step of depositing a second semiconductor film having the other conductivity type;
5. A fifth step of anisotropically etching the second semiconductor film and leaving the second semiconductor film along the side walls of the opening in the multiple layer film;
6. A sixth step of anisotropically etching a third insulating film after its deposition and leaving the third insulating film on the side surface of the second semiconductor film along the side portions of the opening in the multiple layer film;
7. A seventh step of disposing a gate insulating film on the surface of the exposed active region;
8. An eighth step of depositing a conductor film;
9. A ninth step of depositing a sacrificial planarizing layer on the surface to make it substantially flat, etching back at a substantially equal etching rate to the sacrificial planarizing layer and the conductor film and leaving the conductor film inside the opening of the multiple layer film to form a gate electrode; and
10. A tenth step of removing selectively unnecessary portions of the first and second semiconductor films and the conductor film, and providing, inside the active region, source and drain regions of a conductivity type opposite to that of the active region by diffusion of an impurity from the second semiconductor film and forming a part of each source and drain wiring by the first semiconductor film which contacts the second semiconductor film.

A CMOS is fabricated basically according to the above method as follows. A well region (or another active region) having a conductivity type opposite to that of the substrate is formed in the first step. A first high resistance semiconductor film is deposited in place of the first semiconductor film in the second step. A second high resistance semiconductor film is deposited in place of the second semiconductor film in the fourth step. After the ninth step, an impurity is doped in the first and the second high resistance semiconductor films over each active region, the conductivity type of the impurity being selected to be opposite to each active region.

BRIEF DESCRIPTION OF THE DRAWINGS

FIG. 5(a) to 5(j) are sectional views showing a stepwise fabrication process of a CMOS transistor according to the present invention;

DETAILED DESCRIPTION OF THE PREFERRED EMBODIMENTS

Figure 1:
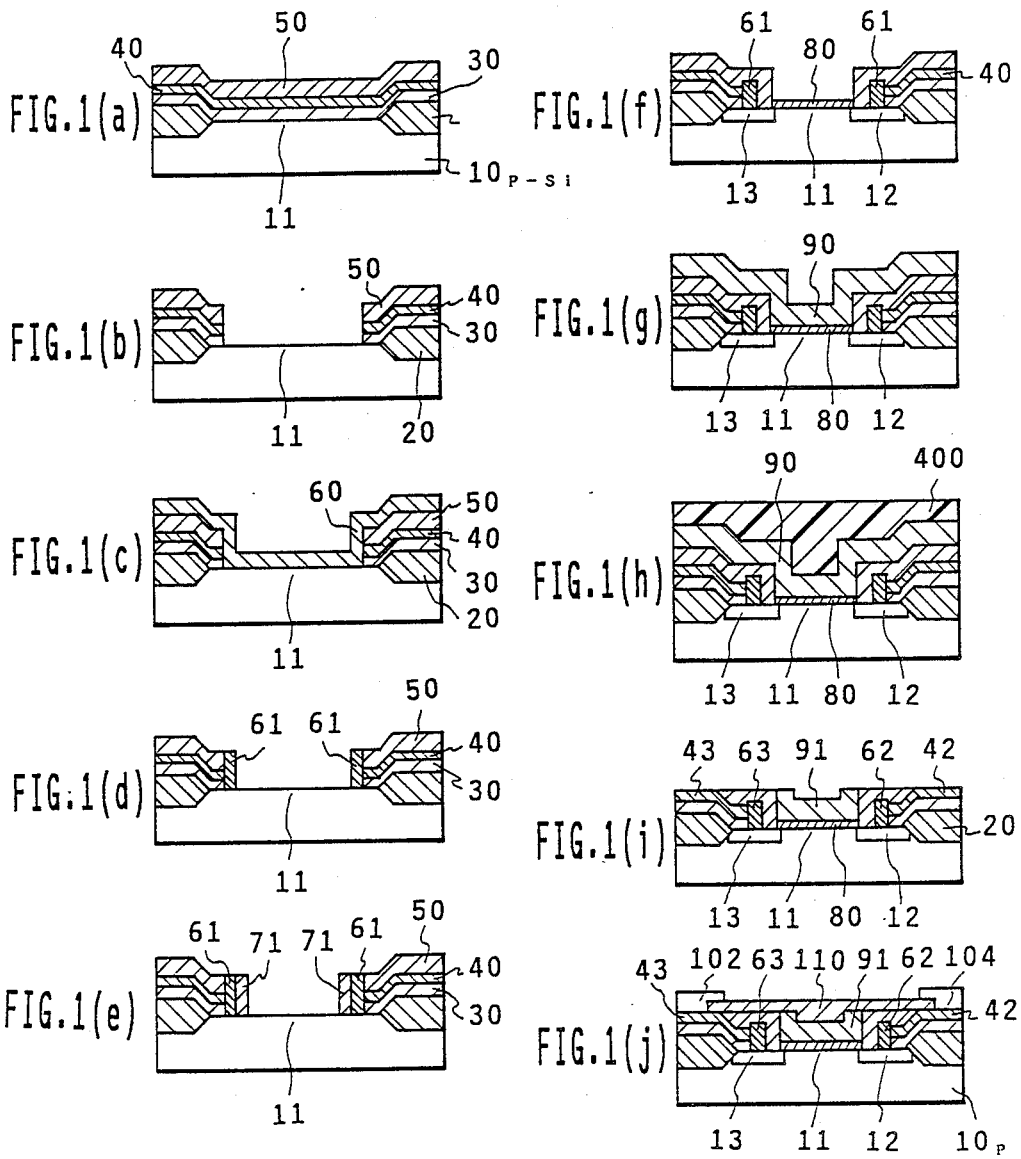
FIG. 1(a) to 1(j) are sectional views showing a stepwise fabrication process of a MOS transistor according to the present invention.

Hereinafter, the present invention is described in detail with reference to the accompanying drawings.

(a) Embodiment 1

In FIG. 1(a), a field oxide film 20 is selectively formed by oxidization or the like on the surface of a P-type silicon substrate, an active region on which a transistor is to be formed is exposed and a three-layer film consisting of a first insulating film 30, a first semiconductor film 40 and a second insulating film 50 ar deposited sequentially on a P-type silicon substrate 10. The active region 11 is formed inside a broken line 11 shown in FIG. 2. The first insulating film 30, the first semiconductor film 40 and the second insulating film 50 respectively comprise, for example, CVD $SiO_2$ (0.2 $\mu$m), Poly-Si (0.4 $\mu$m) and $SiO^2$ (0.2 $\mu$m). The Poly-Si contains a P-type impurity. Any thickness can be selected for each layer within the permissible range of process design.

FIG. 1(b) is a sectional view wherein an opening is formed in the multiple layer film so as to expose the active region 11. One of the opposing sides of the opening should be formed on the field oxide film 20, while the other opposing sides should be formed within the active region. The sides of the opening must be etched substantially vertically or negatively inclined by reactive ion etching (RIE) or ion beam etching. FIG. 1(c) shows the section where a P-type semiconductor film 60 such as poly-Si is deposited isotropically in a thickness of, e.g., 0.5 $\mu$m by vacuum CVD or the like. In FIG. 1(d), the second semiconductor film 60 is anisotrapically etched by RIE or the like so as to expose the active region 11 and the second insulating film 50 and to leave part of the second semiconductor film 61 along the side surfaces of the opening. After a third insulating film 70 consisting of CVD $SiO_2$ or the like is deposited, a part of the third insulating film 71 is left along the side surface of the second semiconductor film 61 by anisotropic etching as shown in FIG. 1(e). The thickness of the third insulating film 71 can be controlled by changing its deposition depth or the etching condition. In the case of this embodiment, the thickness of third insulating film 71 is 0.3 $\mu$m.

Figure 2:
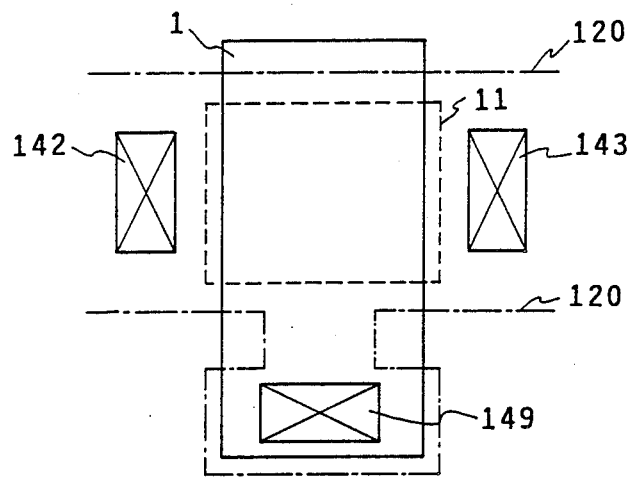
FIG. 2 is a plan view of the MOS shown in FIG. 1.

FIG. 1(f) shows the section where a gate oxide film 80 is disposed on the surface of the active region 11 by thermal oxidization or the like. Through this heat treatment, N-type source and drain regions 13 and 12 are formed inside the active region 11 by diffusion of the impurity from the second semiconductor film 61. Thereafter, a conductor film 90 such as N-type poly-Si is deposited (FIG. 1(g)), a sacrificial planarizing layer 400 such as a resist is deposited on the entire surface (FIG. 1(h), and the surface is etched-back leaving a part of the conductor film 91 only inside the opening in the multiple layer film (FIG. 1(i)). This etch-back is carried out at a rate substantially equal to the etching rate of the sacrificial planarizing layer 400 and the conductor film 90 to such an extent that the second insulating film 50 is at least exposed but the first semiconductor film 40 does not disappear. In this embodiment the etch-back is carried out to the extent that the first semiconductor film 40 is exposed as shown in FIG. 1(i). During the following masking step, a region within the line 120 as shown in FIG. 2 is selectively etched in order to leave the first and second semiconductor films 40, 61 and the conductor film 91 inside the line 120. As a result, source and drain wirings 42 and 43 are formed by the first semiconductor film 40, source and drain electrodes 62 and 63 by the second semiconductor film 61 and the gate electrode 91 by the conductor film 90. Depending upon the requirement, an insulating film 110 such as $SiO_2$ is deposited thereafter, contact holes such as 142, 143 and 149 are opened as shown in FIG. 2, and Al wirings such as 102 and 103 are provided to complete a semiconductor device as shown in FIG. 1(j). Although the embodiment described above uses $SiO_2$ for the first, second and third insulating films, SiN, SiON, PSG, BPSG and the like or a combination thereof can be used. Further, it is possible to use a multiple layer film of a metal having a high melting point for the conductor film 90, and poly-Si for the first and second semiconductor films 40 and 60.

(b) Embodiment 2

Figure 3A:
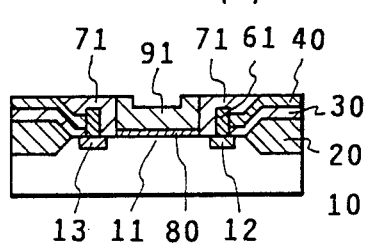
FIG. 3(a) to 3(c) are sectional views showing the fabrication process of a MOS device having an LDD structure according to the present invention.
Figure 3C:
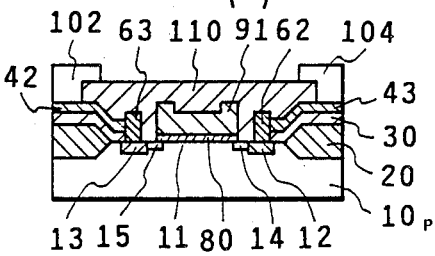
Figure 3B:
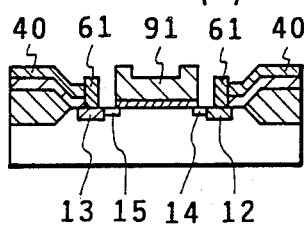

FIGS. 3(a) to 3(c) are sectional views of a MOS device having LDD structure in the process order according to the present invention. FIG. 3(a) shows a section of the device wherein the same steps (a) to (i) as shown in FIG. 1 have been completed, which is just before the step of masking and selective etching of the first and second semiconductor films 40 and 61, and the conductor film 91. However, diffusion of the N-type source and drain regions 12 and 13 is restricted to a smaller extent than that in the case of Embodiment 1 so that both regions 12 and 13 do not overlap with a gate electrode 91 defined by the conductor film insulating film 71 exposed on the surface is removed by use of the conductor film 91 and the first and second semiconductor films 40 and 61 as masks. An N-type impurity is then implanted into regions defined by the same masks as abovementioned and the field oxide film 20 to form low impurity concentration source and drain regions 14 and 15. Thereafter, unnecessary portions of the first and second semiconductor films 40 and 61 and the conductor film 91 are selectively etched, an insulating film 110 is deposited, contact holes are opened, and metal wiring is carried out to complete the semiconductor device as shown in FIG. 3(c). In the step shown in FIG. 3(b), it is not necessary to completely remove the third insulating film 71 but only to reduce the same to a thickness where the N-type impurity can be implanted by selective ion implantation.

(c) Embodiment 3

Figure 4A:
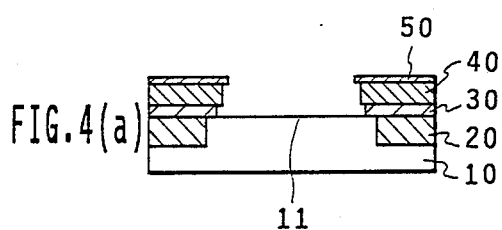
FIG. 4(a) to 4(f) are sectional views showing a stepwise fabrication process of another embodiment of a MOS device according to the present invention.
Figure 4E:
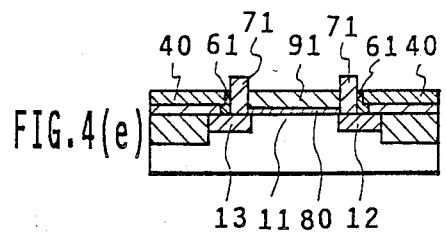
Figure 4B:
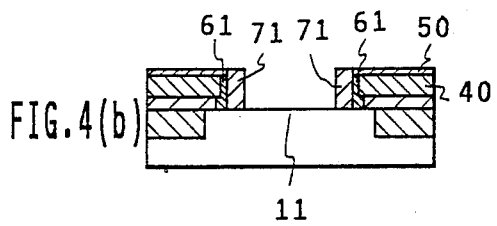
Figure 4F:
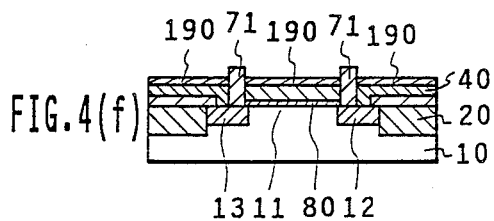
Figure 4C:
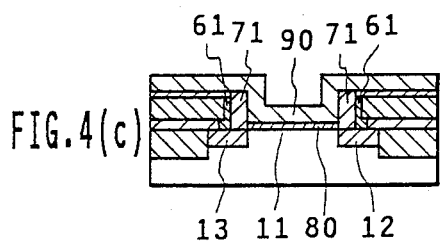
Figure 4D:
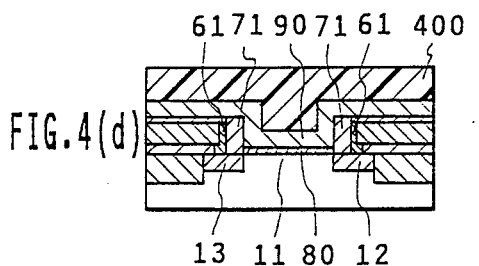

FIGS. 4(a) to 4(f) are sectional views showing the fabrication of a MOS device according to the invention and which has a lowered wiring resistance. FIG. 4(a) shows a step in which a three-layered film consisting of a first oxide film 30, a first poly-Si 40 and a second insulating film 50 on a field insulating film 20 are disposed on an active region 11. In this embodiment, for example, an SiN film is used as the second insulating film 50. The side walls of the opening are formed negatively inclined. FIG. 4(b) shows a section where a second poly-Si 61 and a third oxide film 71 are formed on the side walls of the opening. FIG. 4(c) shows a step where poly-Si 90 is deposited after a gate oxide film 80 is formed. Thereafter, a sacrificial planarizing layer 400 (resist, SOG, bias sputter film, etc.) is deposited as shown in FIG. 4(d) and etch-back is carried out. Etchback should selectively be carried out so that the third oxide film 71 sufficiently remains, and it should reach the first poly-Si 40 as shown in FIG. 4(e). FIG. 4(e) shows a step where a metal film 190 of W, Al or the like is deposited selectively on the first, second and third poly-Si 40, 61 and 91 using the third oxide film 71 as a mask. The subsequent steps are similar to those of Embodiments 1 and 2.

(d) Embodiment 4

Figure 6:
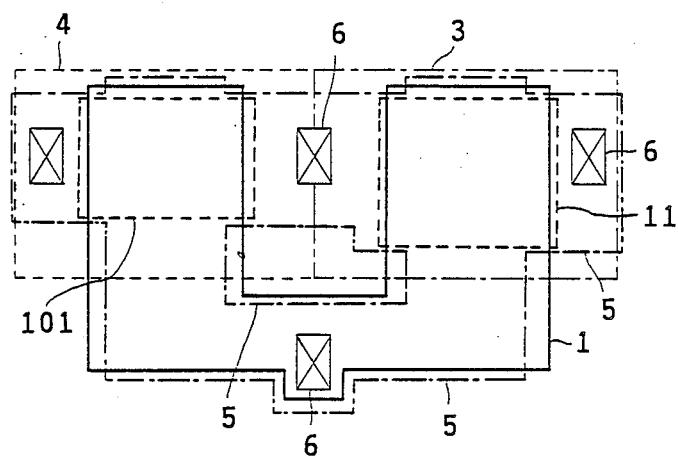
FIG. 6 is a plan view of the CMOS shown in FIG. 5.

A CMOS device is fabricated basically according to the process employed in the Embodiment 1. In order to fabricate a CMOS device according to the present invention, the following steps are carried out in addition to the steps employed in the Embodiment 1. In FIG. 5(a), adjacent to a first active region 11, an N-type well 100 is formed to provided a second active region 101 in a P-type Si substrate before the substrate surface is selectively oxidized to form a field oxide film 20. Three layers of a first insulation film 30, a first semiconductor film 200 and a second insulation film 50 are successively deposited. In this case, the first semiconductor film 200 is composed of high resistance semiconductor or low impurity concentration semiconductor. In FIG. 5(b), a first opening 1 and a second opening 2 are formed in the multiple layer film over the first and second active regions respectively, and a second semiconductor film of high resistance 300 is deposited thereon. As shown in FIG. 6, one opposing sides of each opening are formed within the active region, and the other opposing sides are formed outside of the active region. Thereafter, the second semiconductor film 300 is anisotropically etched to leave parts of the second semiconductor film 160 and 301 along the walls of the openings. In FIG. 5(d), a third insulating film 70 composed of CVD SiO2 or the like is deposited, and anisotropical etching is carried out to leave parts of the third insulating film 171 and 71 along the side walls of the openings. Gate insulating films 180 and 80 are provided as shown in FIG. 5(e). After depositing a conductor film of, e.g., N-type Poly-Si as shown in FIG. 5(f), a sacrificial planarizing layer 400 is deposited thereon as shown in FIG. 5(g) and etch-back is carried out at a rate substantially equal to the etching rate of the sacrificial planarizing layer 400 and the conductor film 90 in order to leave the conductor film 191 and 91 only inside the openings (FIG. 5(h)). The etch back is carried out to an extent that the second insulation film 50 is at least exposed but the first semiconductor film 40 does not disappear. In this embodiment, the etch-back is carried out to an extent that the first semiconductor film 40 is exposed. In FIG. 5(i), N-type impurity is selectively doped in the first and second semiconductors 200 and 301 over the first active region, and N-type source and drain regions 12 and 13 are formed inside the first active region 11 by diffusion of the impurity from the second semiconductor film 301. In a similar manner, P-type source and drain regions 112 and 113 are formed inside the second active region 101. The impurity doping is carried out by ion implantation or the like with the use of masks whose areas are defined by lines 3 and 4 as shown in FIG. 6.

During the following masking step, etching is selectively carried out in order to leave the first and second semiconductor films 200, 301 and 161, and conductor films 91 and 191 within the area defined by the line 5 as shown in FIG. 6. As a result, N and P source wirings 202 and 142, and N and P drain wirings 203 and 161 are formed by the first semiconductor film 40; N-type source and drain electrodes 302 and 303 are formed by the second semiconductor 301, P-type source and drain electrodes 162 and 163 are formed by the second semiconductor 161; and gate electrodes 91 and 191 ar formed by the conductor films 91 and 191. Depending upon the requirement, an insulating film 300 such as SiO2 is deposited thereafter, contact holes 6 are provided as shown in FIG. 6, and Al wirings such as 205 and 204 are provide to complete a semiconductor device as shown in FIG. 5(j). Although the embodiment described above uses SiO2 for the first, second and third insulating films, SiN, SiON, PSG, BPSG and the like or a combination thereof can be used. Further, it is possible to use a multiple layer film of a metal having a high melting point for the conductor film 90, and poly-Si film for the first and second semiconductor films 200 and 300. As for the conductor film 90, a conductor film of high resistance can be deposited in the step shown in FIG. 5(f), and later in the step shown in FIG. 5(i) the resistance can be increased to a required level.

(e) Embodiment 5

Figure 7A:
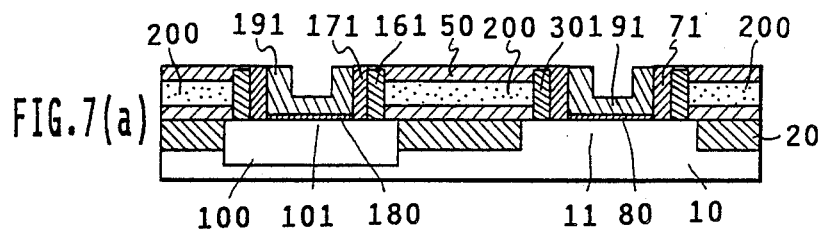
FIG. 7(a) to 7(d) are sectional views showing the fabrication process of a CMOS device having an LDD structure according to the present invention.
Figure 7B:
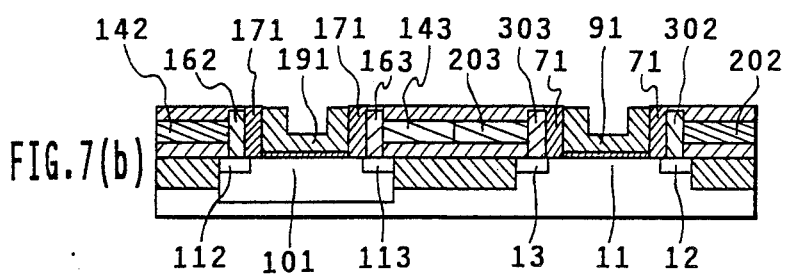

FIGS. 7(a) to 7(d) show a manufacturing process to fabricate an LDD.CMOS device according to the present invention. FIG. 7(a) shows a step corresponding to the step as shown in FIG. 5(h). FIG. 7(b) shows a section in which N and P-type impurities are ion-implanted through the second insulating film 50 to form N-type first and second semiconductor films 202, 203, 302 and 303 and p-type first and second semiconductor films 142, 143, 162 and 163. At the same time, N-type source and drain regions 12 and 13 and P-type source and drain regions 112 and 113 are formed by diffusion of the impurity through the second semiconductor films 202, 203, 142 and 143. However, diffusion of each of the source and drain regions 12, 13, 112 and 113 is restricted to a smaller extent than that in the case of Embodiment 4 so that those regions do not overlap with the gate electrodes 91 and 191.

Figure 7C:
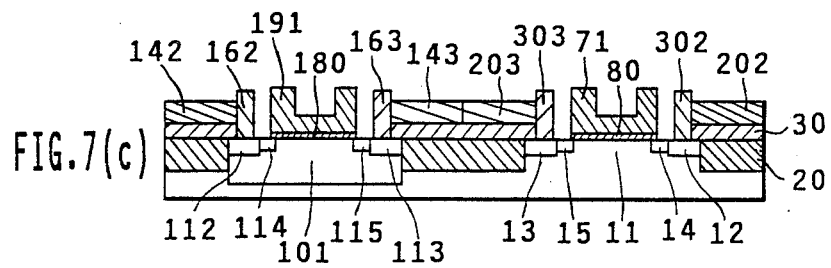
Figure 7D:
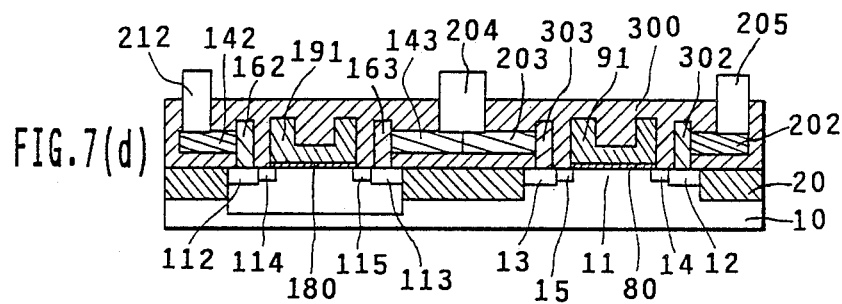

In FIG. 7(c), the third insulating films 71 and 171 are removed (but the field oxide film 20 is not removed), N-type impurity is ion-implanted in the first active region 11 to form source and drain regions 14 and 15 of low impurity concentration, and P-type impurity is ion-implanted in the second active region to form source and drain regions 114 and 115 of low impurity concentration. FIG. 7(d) shows a finished CMOS device wherein unnecessary portions of the first and second semiconductor films 202, 203, 302, 303, 142, 143, 162 and 163 and conductor films 91 and 191 are selectively etched, an insulation film 300 is deposited, contact holes are opened, and metal wiring is carried out. It is not necessary to completely remove the third insulating film 71 and 171 but only to reduce the same to a thickness where the N-type impurity can be implanted by selective ion implantation. Further, LDD structure can be formed only in the NMOS side, if required.

(f) Embodiment 6

Figure 8A:
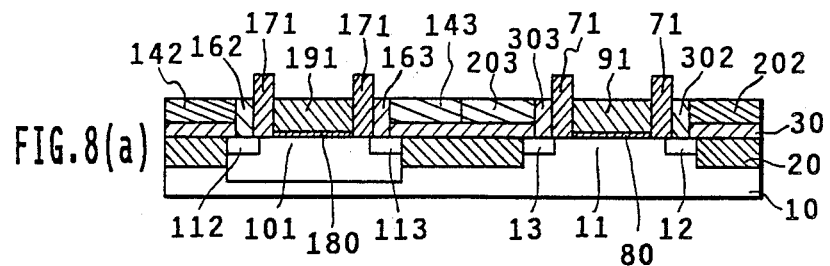
FIG. 8(a) to 8(d) are sectional views showing a stepwise fabrication process of another embodiment of a CMOS device according to the present invention.
Figure 8B:
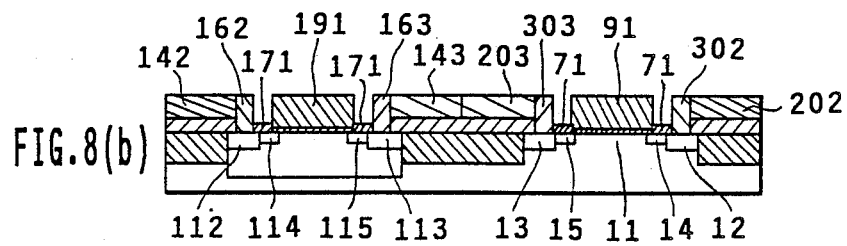
Figure 8C:
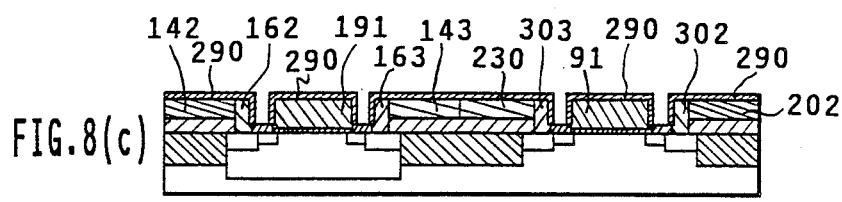
Figure 8D:
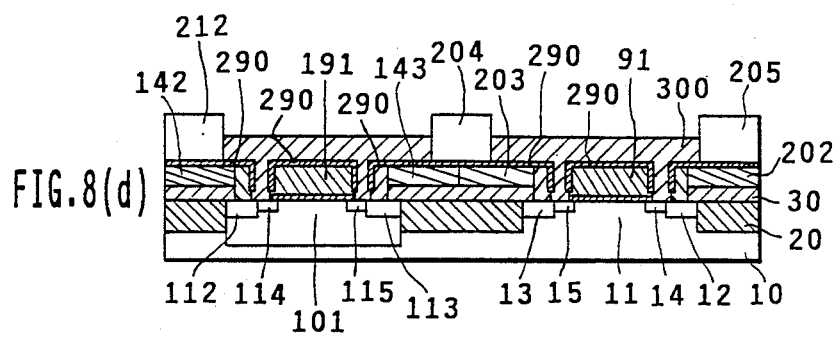

FIGS. 8(a) to 8(d) are sectional views showing the fabrication of a CMOS device according to the invention and which has a lowered wiring resistance. FIG. 8(a) shows a step corresponding to the step as shown in FIG. 5(i) of Embodiment 4 or in FIG. 7(b) of Embodiment 5. In this embodiment, etch-back is carried out until the second insulating film 50 is removed. In FIG. 8(b), the third insulating films 71 and 171 are thinned, N-type impurity is ion-implanted in the first active region 11 to form source and drain regions 114 and 115 of low impurity concentration, and p-type impurity is ion-implanted in the second active region 101 to form source and drain regions 114 and 115 of low impurity concentration. In FIG. 8(c), a metal film 290 of W, Al or the like is selectively deposited on the first and second semiconductor films 202, 203, 302, 303, 142, 143, 162 and 163, and conductor films 91 and 191. Thereafter, unnecessary portions of the first and second semiconductor films 202, 203, 302, 303, 142, 143, 162 and 163, and conductor films 91 and 191 are selectively etched, an insulating film 300 is deposited, contact holes are opened and metal wiring is carried out to complete the semiconductor device as shown in FIG. 7(d). The deposition of the metal film 290 can be carried out after the step shown in FIG. 7(a).

In accordance with the present invention described above, not only gate electrodes can be formed by self-alignment, but also wiring of Si or the like can be directly contacted with miniature source and drain regions. Accordingly, the present invention makes it possible to manufacture an insulated gate semiconductor device having an extremely small parasitic capacitance, which results in high speed and high integration density of semiconductor devices. Moreover, since the LDD structure can easily be fabricated, the present invention is extremely effective in the fabrication of miniature semiconductor devices.

I claim:

1. A fabrication method of an insulated gate semiconductor device comprising:
    a first step of exposing an active region of a given with on a surface of a semiconductor substrate having a first conductivity type, and covering other regions with a field insulating film;
    a second step of sequentially depositing a multiple layer film of at least three layers comprised of a first insulating film, a first semiconductor film having a second conductivity type and a second insulating film;
    a third step of providing an opening in said multiple layer film on said active region in such a manner that said opening is narrower than the width of said active region so that one of the opposed sides of said opening is inside said active region while the other of the opposed sides is on said field insulating film, the walls of said opening being formed vertically or negatively inclined;
    a fourth step of depositing a second semiconductor film containing an impurity of the second conductivity type;
    a fifth step of etching anisotropically said second semiconductor film to expose said active region and said second insulating film for leaving said second semiconductor film along the walls of said opening in said multiple layer film;
    a sixth step of depositing a third insulating film and etching anisotropically said third insulating film to expose said active region and leaving said third insulating film only on the side surface of said second semiconductor film formed along the walls of said opening in said multiple layer film;
    a seventh step of providing a gate insulating film on the surface of said active region by thermal oxidization and providing source and drain regions of the second conductivity type in said active region by diffusion of the impurity from said second semiconductor film;
    an eighth step of depositing a conductor film;
    a ninth step of depositing a sacrificial planarizing layer over the entire surface, and etching-back the surface at an etch rate substantially equal to that of the sacrificial planarizing layer and said conductor film for leaving said conductor film inside said opening in said multiple layer film to an extent that at least said second insulating film is exposed; and
    a tenth step of selectively removing unnecessary portions of said first and second semiconductor films and said conductor film to form parts of source and drain wirings with said first semiconductor film, source and drain electrodes with said second semiconductor film, and a gate electrode with said conductor film.

2. The fabrication method of an insulated gate semiconductor device as defined in claim 1, further comprising a step, after the ninth step, of selectively introducing a low concentration impurity of the second conductivity type into said active region between said conductor film and said second semiconductor film after removing said third insulating film or reducing the thickness thereof.

3. The fabrication method of a insulated gate semiconductor device defined in claim 2, wherein said conductor film comprises a third semiconductor film and the etching in the ninth step is carried out until said first semiconductor film is exposed.

4. The fabrication method of an insulated gate semiconductor device as defined in claim 3, further comprising a step, after the ninth step, of selectively depositing a metal film on the exposed surface of said first and third semiconductor films.

5. The fabrication method of an insulated gate semiconductor device as defined in claim 1, wherein said conductor film comprises a third semiconductor film and the etching in the ninth step is carried out until said first semiconductor film is exposed.

6. The fabrication method of an insulated gate semiconductor device as defined in claim 5, further comprising a step, after the ninth step, of selectively depositing a metal film on the exposed surface of said first and third semiconductor films.

7. A fabrication method of an insulated gate semiconductor device comprising:
    a first step of providing in a semiconductor substrate of a first conductivity type a well of a second conductivity type to form a second active region of a given width adjacent to a first active region of a given width, exposing said first and second active regions, and covering other regions with a field insulating film;
    a second step of sequentially depositing a multiple layer film of at least three layers comprised of a first insulating film, a first semiconductor film of high resistance and a second insulating film;
    a third step of providing openings in said multiple layer film on said first and second active regions in such a manner that each of said openings is narrower than the width of its corresponding active region so that one of the opposing sides of each opening is inside its corresponding active region while the other of the opposing sides is on said field insulating film, the walls of said opening being formed vertically or negatively inclined;
    a fourth step of depositing a second semiconductor film of high resistance;
    a fifth step of anisotropically etching said second semiconductor film to expose said active regions and said second insulating film for leaving said second semiconductor film along the walls of said openings in said multiple layer film;
    a sixth step of depositing a third insulating film and etching anisotropically said third insulating film to expose said active regions and leaving said third insulating film only on the side surfaces of said second semiconductor film formed along the walls of said openings in said multiple layer film;
    a seventh step of providing gate insulating films on the surface of said active regions by thermal oxidization;

an eighth step of depositing a conductor film;

a ninth step of depositing a sacrificial planarizing layer over the entire surface, and etching-back the surface at an etch rate substantially equal to that of the sacrificial planarizing layer and said conductor film for leaving said conductor film inside said openings in said multiple layer film to an extent that at least said second insulating film is exposed;

a tenth step of selectively implanting in said first and second semiconductor films an impurity of the first conductivity type over said second active region and another impurity of the second conductivity type over said first active region by ion implantation thereby forming source and drain regions of the first conductivity type in said second active region by impurity diffusion from said second semiconductor film and source and drain regions of the second conductivity type in said first active region by impurity diffusion from said second semiconductor film; and an eleventh step of selectively removing unnecessary portions of said first and second semiconductor films and said conductor film to form parts of source and drain wirings and with said first semiconductor film contacting said second semiconductor film, and gate electrodes with said conductor film.

8. The fabrication method of an insulated gate semiconductor device as defined in claim 7, further comprising a step, after the ninth step or the tenth step, of selectively introducing into at least one of said active regions a low concentration impurity of a conductivity type opposite to that of said active region between said conductor film and said second semiconductor film after removing said third insulating film o reducing the thickness thereof.

9. The fabrication method of an insulated gate semiconductor device as defined in claim 8, wherein said conductor film comprises a third semiconductor film and the etching in the ninth step is carried out until said first semiconductor film is exposed.

10. The fabrication method of an insulated gate semiconductor device as defined in claim 7, wherein said conductor film comprises a third semiconductor film and the etching in the ninth step is carried out until said first semiconductor film is exposed.

11. The fabrication method of an insulated gate semiconductor device as defined in claim 10, further comprising a step, after the tenth step, of selectively depositing a metal film on the exposed surface of said first and third semiconductor films.

12. The fabrication method of an insulated gate semiconductor device as defined in claim 9, further comprising a step, after the ninth step, of selectively depositing a metal film on the exposed surface of said first and third semiconductor films.

* * * * *